US011874596B2

(12) United States Patent
Chiu et al.

(10) Patent No.: US 11,874,596 B2
(45) Date of Patent: Jan. 16, 2024

(54) WORKPIECE CONTAINER SYSTEM

(71) Applicant: GUDENG PRECISION INDUSTRIAL CO., LTD, New Taipei (TW)

(72) Inventors: Ming-Chien Chiu, New Taipei (TW); Chia-Ho Chuang, New Taipei (TW); Hsing-Min Wen, New Taipei (TW); Hsin-Min Hsueh, New Taipei (TW); Shu-Hung Lin, New Taipei (TW)

(73) Assignee: GUDENG PRECISION INDUSTRIAL CO., LTD, New Taipei (TW)

( * ) Notice: Subject to any disclaimer, the term of this patent is extended or adjusted under 35 U.S.C. 154(b) by 0 days.

(21) Appl. No.: 17/216,724

(22) Filed: Mar. 30, 2021

(65) Prior Publication Data

US 2022/0100080 A1    Mar. 31, 2022

Related U.S. Application Data

(63) Continuation-in-part of application No. 17/168,207, filed on Feb. 5, 2021.

(30) Foreign Application Priority Data

Sep. 30, 2020 (TW) .................... 109134304

(51) Int. Cl.
*G03F 1/66* (2012.01)
*B65D 81/02* (2006.01)
*H01L 21/673* (2006.01)

(52) U.S. Cl.
CPC .............. *G03F 1/66* (2013.01); *B65D 81/02* (2013.01); *H01L 21/67369* (2013.01)

(58) Field of Classification Search
CPC ..... G03F 1/66; B65D 81/02; H01L 21/67369; H01L 21/67389
(Continued)

(56) References Cited

U.S. PATENT DOCUMENTS 6,900,878 B2    5/2005  Okubo et al.
2003/0218728 A1*  11/2003  del Puerto ........ H01L 21/67359
                                                     355/75

(Continued)

FOREIGN PATENT DOCUMENTS

JP    2003257852 A    9/2003
JP    2006526432 A    11/2006
(Continued)

*Primary Examiner* — J. Gregory Pickett
*Assistant Examiner* — Jenine Pagan
(74) *Attorney, Agent, or Firm* — ScienBiziP, P.C.

(57) ABSTRACT

The instant disclosure discloses a workpiece container system comprising a storage assembly. The storage assembly comprises a seat member and a seat cover. The seat member defines a workpiece receiving region that encompasses a geometric center region thereof, configured to receive a workpiece; wherein a lower diffuse inducing component is provided on the seat member within a planar projection of the workpiece yet offsets the geometric center region. The seat cover is configured to engage the seat member at a periphery region around the workpiece receiving region thereof, so as to cooperatively form an enclosure for housing the workpiece; wherein an upper diffuse inducing component is provided on the seat cover over the planar projection of the workpiece and protectively overlaps the geometric center region of the seat member.

19 Claims, 7 Drawing Sheets

(58) Field of Classification Search
USPC .......................................................... 206/449
See application file for complete search history.

(56) References Cited

U.S. PATENT DOCUMENTS

| | | | |
|---|---|---|---|
| 2004/0048028 A1* | 3/2004 | Thomas | ............ H01L 21/67369 |
| | | | 428/64.1 |
| 2007/0206173 A1* | 9/2007 | Suzuki | .............. H01L 21/67359 |
| | | | 355/75 |
| 2012/0037522 A1 | 2/2012 | Chiu et al. | |
| 2019/0155139 A1* | 5/2019 | Chang | ........................ G03F 1/40 |
| 2019/0214287 A1* | 7/2019 | Chiu | ................. H01L 21/67359 |
| 2020/0211876 A1* | 7/2020 | Raschke | ........... H01L 21/67359 |

FOREIGN PATENT DOCUMENTS

| | | | |
|---|---|---|---|
| JP | 2008535283 A | 8/2008 | |
| JP | 2010151551 A | 7/2010 | |
| JP | 2019528578 A | 10/2019 | |
| KR | 1020040002437 A | 1/2004 | |
| KR | 1020220124693 A | 9/2022 | |
| TW | 201523126 A | 6/2015 | |
| TW | I649613 B | 2/2019 | |

* cited by examiner

WORKPIECE CONTAINER SYSTEM

CROSS-REFERENCE TO RELATED APPLICATIONS

This application is a continuation-in-part of U.S. patent application Ser. No. 17/168,207, filed on Feb. 5, 2021, which is incorporated herein by reference in its entirety.

This application claims the benefit of Taiwan Patent Application No. 109134304 filed on Sep. 30, 2020, which are hereby incorporated by reference herein and made a part of specification.

FIELD

This present disclosure relates to container for storage, transport, shipping and processing of fragile objects such as photomask, reticle, and wafer, and, in particular, to retaining system for storage, transport, shipping, and processing of a reticle for extreme ultraviolet (EUV) lithography process.

BACKGROUND

In semiconductor industry, workpiece containers (e.g., photomask/reticle retainer) have evolved with the heightened precision requirements of the payload thereof, in order to meet the demand for increased level of workpiece protection from potential ambient hazards.

For example, newer generation reticle retainers are sometimes provided with a dual-pod configuration that includes a storage assembly (e.g., an inner pot unit) for receiving/storing a reticle and a transport assembly (e.g., an outer pot unit) for accommodating/transporting the storage assembly. During transportation, a reticle may be packed inside the storage assembly. For storage purposes, a container system that houses a reticle therein may be transported (e.g., by a robot under an atmosphere environment) to an outer pod opener. Thereafter, the transport assembly can be opened by the opener to allow retrieval of the storage assembly therefrom. Then, the inner pod may be carried (e.g., by a robot under a vacuum environment) to a vacuum reticle library and be stored therein. For executing a lithography process, the storage assembly may be opened upon arriving at a designated position inside an exposure apparatus prior to a subsequent exposure process that employs the contained reticle.

However, when using the container system to store/transport a workpiece, there may be particulate contaminants, gas-phase contaminants (e.g., outgas or humidity), or airborne molecular contaminants (AMC) inside the storage assembly. The contaminants may adversely impact the received workpiece. There is therefore a need for a contamination control mechanism for the container system.

BRIEF DESCRIPTION OF THE DRAWINGS

So that the manner in which the recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

Figure 1:
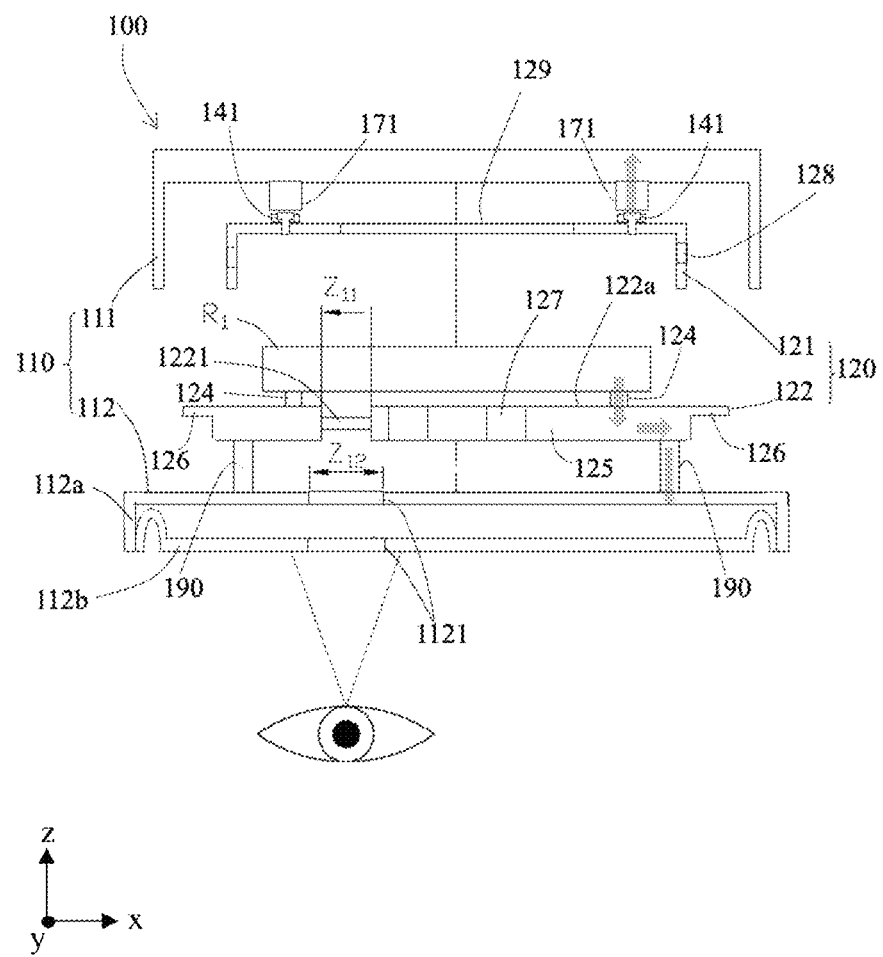
FIG. 1 illustrates a schematic cross-sectional view of a workpiece container system in accordance with some embodiments of the instant disclosure.

It is to be noted, however, that the appended drawings illustrate only exemplary embodiments of this disclosure and are therefore not to be considered limiting of its scope, for the disclosure may admit to other equally effective embodiments.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of layers, regions and/or structural elements may be reduced or exaggerated for clarity. The use of similar or identical reference numbers in the various drawings is intended to indicate the presence of a similar or identical element or feature.

DETAILED DESCRIPTION

The present disclosure will now be described more fully hereinafter with reference to the accompanying drawings, in which exemplary embodiments of the disclosure are shown. This disclosure may, however, be embodied in many different forms and should not be construed as limited to the exemplary embodiments set forth herein. Rather, these exemplary embodiments are provided so that this disclosure will be thorough and complete, and will fully convey the scope of the disclosure to those skilled in the art. Like reference numerals refer to like elements throughout.

The terminology used herein is for the purpose of describing particular exemplary embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The description will be made as to the exemplary embodiments in conjunction with the accompanying drawings in FIGS. 1 to 7. Reference will be made to the drawing figures to describe the present disclosure in detail, wherein depicted elements are not necessarily shown to scale and wherein like or similar elements are designated by same or similar reference numeral through the several views and same or similar terminology.

FIG. 1 illustrates a schematic cross-sectional view of a workpiece container system in accordance with some embodiments of the instant disclosure. For illustrational simplicity and clarity, some detail/sub components of the exemplary device may not be explicitly labeled/shown in the instant figure.

Referring to FIG. 1, the exemplary workpiece container system 100 comprises an inner pod (e.g., a storage assembly 120) configured to store a workpiece (e.g., a reticle) and an outer pod (e.g., a transport assembly 110) configured to house the storage assembly 120.

In the illustrated embodiment, the storage assembly 120 comprises a seat member 122 and a seat cover 121 configured to engage the seat member 122, so as to cooperatively form an interior volume for accommodating the workpiece (e.g., reticle $R_1$) upon enclosure.

The seat member 122 is configured to be conveyable from one chamber to another by a robot arm of a semiconductor apparatus. For example, the exemplary seat member 122 is formed with a storage portion 125 (e.g., a central portion, on which the workpiece $R_1$ is received/supported) and a pair of flank portions 126 extending laterally outward from the storage portion 125. The storage portion 125 is provided with a workpiece receiving surface 122a for receiving the workpiece. In the illustrated embodiment, the seat member 122 is further provided with supporting element (e.g., supporting post 124) arranged on a top surface of the storage portion 125 for supporting the reticle $R_1$. The pair of flank portions 126 are arranged on opposite sides of the storage portion 125. In the current cut view, the flank portion 126 is provided with a thickness thinner than the storage portion 125. Such thickness difference generates a step profile near an edge portion of the seat member 122. The pair of stepped profiles is configured to serve as contact interfaces with a robot arm having a fork-like structure. Such arrangement allows the seat member 122 to be laterally retained and vertically supported by the fork-like arm.

In some scenarios, the stored workpiece may be a substrate (e.g., an extreme ultraviolet lithography reticle $R_1$). It is essential that the functional surface of the reticle $R_1$ (i.e., the downward facing surface that hosts a mask layout pattern) be kept free of contaminants so as to prevent damage thereto or distortion to the image projected onto a photoresist layer during lithography process.

In some embodiments, the seat cover 121 is configured to engage the seat member 122 at a periphery region around the workpiece receiving region 122a thereof, so as to cooperatively form an enclosure for housing the workpiece. To protect the sensitive and fragile workpiece from particles/contaminants outside the storage assembly 120, the engagement between the seat member 122 and the seat cover 121 may be provided with a certain degree of air tightness. Moreover, in order to provide thorough protection to its sensitive and fragile content, the seat cover 121 and the seat member 122 may be provided with electromagnetic interference (EMI) shielding property. Suitable material for providing EMI shielding capability may include conductive material such as metal. In some embodiments, the seat member 122 and the seat cover 121 are substantially made of metal, such as aluminum. In some embodiments, surface treatments such as metallic coating (such as copper or gold), hydrophobic and/or hydrophilic treatment may be further provided over selective regions of the surface of the storage assembly 120.

Besides the aforementioned particulate contaminants, there may be gas-phase contaminants or airborne molecular contaminants (AMC) inside the sealed storage assembly. Even the storage assembly can be sealingly engaged, there is the possibility of air entering into the system when the workpiece is removed from and replaced within the container system during processing. For example, moisture in the air can be found inside the storage assembly 120. At a suitable dew point temperature, the some of the moisture will condense out of the air and may get deposited onto the reticle $R_1$. Other sources of gas-phase or vapor contamination (such as $NH_3$ (ammonia) and $SO_2$ (sulphur dioxide)) are solvent residues resulting from reticle/pod cleaning operations during the photomask lifecycle. Some of these chemicals and the moisture may facilitate haze formation on a reticle that is made of quartz. Haze formation and/or water vapor condensing onto the patterned surface of the reticle $R_1$ may interfere with the optics, which may result in distortion of a pattern transferred on a semiconductor wafer during a lithography process.

The exemplary inner pod 120 is provided with one or more diffuse inducing component (e.g., components 127, 128, and 129) that allows reduction or removal of the gas-phase contaminants or airborne molecular contaminants from the inner pod 120. For instance, the provision of the diffuse inducing components allows diffusion of moisture from inside the storage assembly to the outside ambient (e.g., when humidity inside the storage assembly is substantially greater than that in the ambient, or when the system is purged with clean dry air).

The interior moisture may be allowed to diffuse out of the inner pod 120 via the one or more diffuse inducing component. As such, the water deposition or haze formation on the reticle can be alleviated. In some embodiments, the diffuse inducing components may include a plurality of channels/ports/through holes formed on the cover/base of the storage assembly that enables fluid communication between the interior and exterior of the inner pod. In some embodiments, the diffuse inducing components may further include a filter element that is configured to prevent particulate contaminants from passing there-through.

While the top-facing surface of the cover unit of the storage assembly 120 (e.g., cover member 121) is a convenient location for an upper diffuse inducing component (e.g., diffuse inducing component 129 arranged above the received workpiece), a top-mounted diffusing member along may not provide sufficient level of humidity extraction efficiency in certain applications (particularly at regions around the bottom face of the workpiece).

For instance, in some embodiments, a separation between top surface of the seat member 122 and the bottom face of the received workpiece is no more than 0.3 mm upon assembly. A narrow separation may not favor air-flow inducement under the workpiece. As such, there may be difficulties for the gas-phase contaminants such as moisture under the workpiece to travel over the workpiece toward the top-mounted diffusing member.

To further boost diffusing efficiency, the seat member 122 of the exemplary embodiment is provided with a lower diffuse inducing component 127 arranged below the workpiece. Such arrangement facilitates diffusion of moisture under the workpiece for enhanced extraction effectiveness.

In the illustrated embodiment, the transport assembly 110 comprises an outer base 112 configured to receive the seat member 122 and an outer cover 111 configured to engage the outer base 112 (and cover the storage assembly 120). In some embodiments, either one or both of the outer base 112 and the outer cover 111 may be provided with static charge dissipation property to allow the release of electrical charge accumulated on the stored workpiece or the storage assembly. For instance, in some embodiments, the outer pod 110 may be constructed from polymer material mixed with conductive fibers. In some embodiments, either one or both of the outer cover 111 and outer base 112 are made from carbon fibers embedded resin material.

In some embodiment, the outer pod 110 may be further provided with one or more gas inlet port (not shown) configured to allow the entrance of clean dry air (CDA), extra CDA or dry inert gases (such as nitrogen) from a source. In some embodiment, the outer pod 110 may be further provided with one or more gas outlet port configured to allow reduction or removal of the gas inside the outer pod 110. In some embodiments, the gas inlet and/or outlet port may be further provided with a valve configured to control the flow inside the ports.

In some embodiments, a pressing unit (e.g., hold down pin 141) may be provided on a top surface of the seat cover 121 for pressing/holding the workpiece. The exemplary outer pod 110 is further provided with a pushing element 171 arranged in correspondence with the hold down pin 141 of the storage assembly 120. When the outer cover 111 is coupled to the outer base 112, the pushing element 171 pushes the hold down pin 141 to press/hold the workpiece $R_1$, thereby restraining movement of the workpiece upon receipt.

In the illustrated embodiment, the pushing element 171 is configured to push the hold down pin 141 at an exposed portion thereof (e.g., a top surface of the hold down pin 141). In the illustrated embodiment, a width of a projected area of the hold down pin 141 (e.g., the exposed portion of the pressure receiving surface thereof) is smaller than that of the pushing element 171.

In some embodiments, the pushing element 171 and the hold down pins 141 are further provided with charge dissipation property. Accordingly, when the outer cover 111 is coupled to the outer base 112, the pushing element 171 pushes the hold down pin 141 to press the workpiece $R_1$ and establishes a charge dissipation paths (indicated by shaded arrows in the instant figure) from the received workpiece $R_1$, through the hold down pin 141 and the pushing element 171, to the outer cover 111. In some operation scenarios, the outer cover 111 may be grounded, so as to allow accumulated charges on the received workpiece $R_1$ to be dissipated through the charge dissipation path to the ground. The material for the hold down pin 141 may comprise conductive or static dissipative material, thereby making the hold down pin 141 part of the charge dissipating path to enable grounding there-though. In some embodiments, the hold down pin 141 and the pushing element 171 are provided with surface resistance value in a range from about $10^6$ to $10^{11}\Omega$. In some embodiments, the hold down pin 141 and the pushing element 171 are provided with surface resistance value less than about $10^5\Omega$.

In the illustrated embodiment, the outer pod 110 further includes a supporting structure 190 arranged on the outer base 112 configured to support the storage assembly 120. The supporting structures 190 may be integrally formed with or be mounted on the outer base 112. In some embodiments, the supporting elements 124 of the storage assembly 120 and the supporting structure 190 of the outer pod 110 are further provided with charge dissipation property. Accordingly, when the outer cover 111 is coupled to the outer base 112 (and thus the supporting elements 124 on the seat member 122 establishes contact with the workpiece $R_1$), a charge dissipation path (indicated by shaded arrows in the instant figure) may be formed from the received workpiece $R_1$, through the supporting element 124, the seat member 122 and the supporting structure 190, to the outer base 112. In some embodiments, the supporting elements 124 and the supporting structure 190 have surface resistance value in a range from about $10^6$ to $10^{11}\Omega$. In some embodiments, the supporting elements 124 and the supporting structure 190 have surface resistance value less than about $10^5\Omega$.

Still referring to FIG. 1, the exemplary system has a first observable zone $Z_{11}$ defined in the workpiece accommodating region 122a of the seat member 122 to allow observation of the reticle $R_1$. In some embodiment, the first observation zone $Z_{11}$ may be provided with a window that comprises a signal transmissive structure (e.g., an opening or a signal transmissive member). For example, the exemplary seat member 122 includes an inner optical member 1221 arranged in the first observable zone $Z_{11}$. In some embodiments, the inner optical member 1221 may be made of a signal transmissive material with respect to infrared light, visible light, or ultraviolet signal. Suitable material of the inner optical member 1221 may include glass (e.g., quartz glass), acrylic, transparent plastic, or other comparable materials. In the illustrated embodiment, the inner optical member 1221 may include a piece of quartz glass embeddedly arranged in the seat member 122 (in the workpiece accommodating region 122a).

In the illustrated embodiment, the first observable zone $Z_{11}$ is correspondingly designed to allow observation of an identification feature (e.g., a 1-D or 2-D bar code) of the reticle $R_1$ upon receipt of the reticle $R_1$ (not explicitly shown in the schematic illustration). In some embodiments, the identification feature of the reticle $R_1$ is formed on a window-facing surface thereof and viewable from the first observable zone $Z_{11}$.

In the illustrated embodiment, the outer base 112 has a second observable zone $Z_{12}$ defined thereon. The second observable zone $Z_{12}$ is arranged to be observably aligned to the first observable zone $Z_{11}$ of the storage assembly 120. As such, quick visual identification or optical confirmation (such as the condition of the reticle $R_1$ and the identification) of the reticle $R_1$ retained in the container system 100 may be achieved by optical scanning through the second observable zone $Z_{12}$ and first observable zone $Z_{11}$ without the need to open up the outer pod. Accordingly, the frequency of pod opening may be reduced during semiconductor fabrication process, which in turn minimizes exposure of the sensitive precision workpiece to the potentially hazardous ambient factors.

In the illustrated embodiment, outer base 112 has a hollow body comprising an upper deck 112a configured to support the seat member 122 and a lower deck 112b opposite to the upper deck 112a. In some embodiments, both of the exemplary upper deck 112a and the lower deck 112b may be provided with a structure of substantially horizontal plate. The exemplary lower deck 112b is configured to seal the upper deck 112a. In some embodiments, the lower deck 112b and the upper deck 112a are integrally formed. The exemplary second observable zone $Z_{12}$ is provided with a window that includes two overlapping signal transmissive structure (e.g., outer optical members 1121) respectively arranged in the upper and the lower deck 112a,112b.

In some embodiments, the outer optical member 1121 embedded in the upper deck 112a and/or the lower deck 112b may be made of a signal transmissive material with respect to infrared light, visible light, or ultraviolet. Suitable material of the outer optical member 1121 may include glass (e.g., quartz glass), acrylic, transparent plastic, or comparable materials. In some embodiments, a transmittance value of the outer optical member 1121 is greater than 80% with respect to optical signals in one or more of the abovementioned spectrum ranges. Depending on specific applicational requirement, in some embodiments, the optical members (e.g., outer optical members and/or inner optical member) may include concave/convex surface.

In some embodiments, the inner optical member 1221 has a lower reflectance value than the outer optical member 1121 with respect to wavelength in a range between 600 nm to 950 nm. In some embodiments, the corresponding wavelength range for the optical members may be in a range of about 630 nm to 930 nm. In some embodiments, a reflectance value of the outer optical member 1121 with respect to the abovementioned wavelength range may be less than 15%. In some embodiments, a reflectance value of the inner optical member 1221 with respect to the abovementioned range of wavelength may be less than 0.5%. In some embodiments, the inner optical member 1221 may be further provided with an anti-reflection coating. In some embodiments, the inner optical member 1221 may be further provided with a layer having EMI shielding property.

In some embodiments where dust-resisting and/or dust-proofing requirement is stringent, the outer optical member 1121 in the second observable zone $Z_{12}$ of the outer base 112 may be provided with similar sealing mechanism. However, in applications where inner sealing alone is sufficient, the outer optical member 1121 may be constructed without utilizing sealing mechanism for reduction of structural complexity, weight, and cost concerns.

In some embodiments, the entire bottom face of the outer base may be designed to act as the second observation zone. For example, an outer optical member may occupy the entire bottom of the outer base.

Figure 2A:
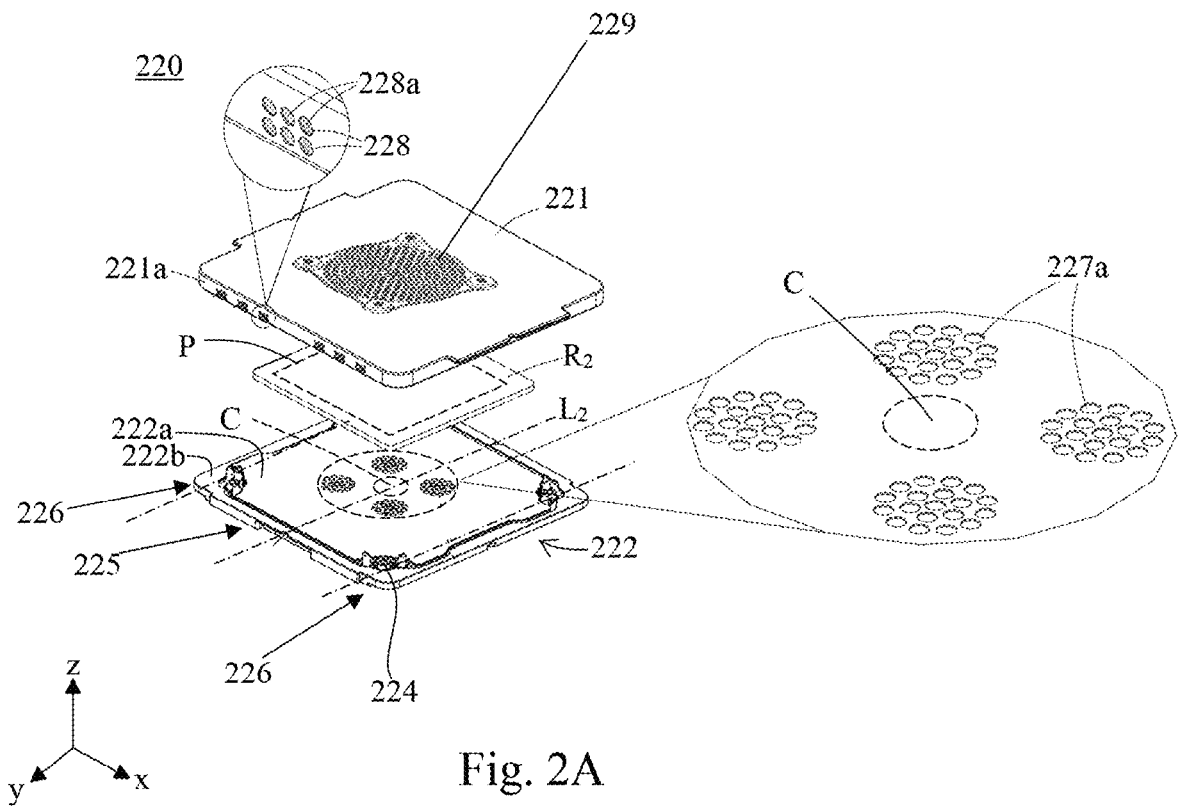
FIG. 2A illustrates an isometric view of a workpiece container system in accordance with some embodiment of the instant disclosure.
Figure 2B:
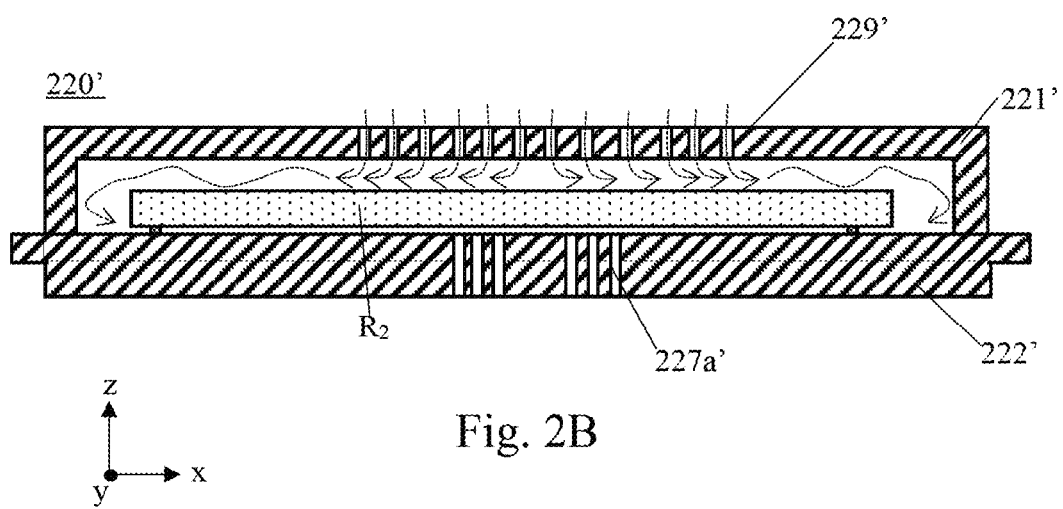
FIG. 2B illustrates a schematic cross-sectional view of a workpiece container system in accordance with some embodiment of the instant disclosure.

Please refer concurrently to FIG. 2A and FIG. 2B. FIG. 2A illustrates an isometric view of a workpiece container system in accordance with some embodiment of the instant disclosure. FIG. 2B illustrates a schematic cross-sectional view of a workpiece container system in accordance with some embodiment of the instant disclosure. For illustrational simplicity and clarity, some detail/sub components of the exemplary device may not be explicitly labeled/shown in the instant figure.

Referring to FIG. 2A, the exemplary storage assembly 220 comprises a seat member 222 and a seat cover 221 configured to cooperatively form an interior volume for accommodating a substrate (e.g., reticle $R_2$). In the illustrated embodiment, the seat member 222 has a substantially rectangular profile that defines a longitudinal axis $L_2$ through a geometric center region C thereof. The seat member 222 comprises a storage portion 225 and a pair of flank portions 226 that extend along the longitudinal axis $L_2$. The exemplary flank portions 226 have a reduced thickness (i.e., thinner than that of the storage portion 225). In the illustrated embodiment, a top face of exemplary seat member 222 defines a workpiece accommodating region 222a and a periphery region 222b that surrounds the workpiece accommodating region. Suitable material and/or coatings for the seat cover 221 and the seat member 222 may be comparable to those described in the aforementioned embodiments.

In some embodiments, the seat cover 221 may be configured to establish pressing engagement with the seat member 222 through pressure from an outer pod (e.g., transport assembly 120) upon enclosure. For example, a pressing engagement between the seat cover 221 and the seat member 222 is formed through a substantially planar metal to metal interface. In the illustrated embodiment, the metal interface is established on the periphery region 222b of the seat member 222. In general, the pressing engagement establishes a sealing enclosure that prevents dust and humidity from entering into the interior volume through the contact interface between the upper and lower members of the storage assembly 220. In some embodiments, either or both of the seat cover and the seat member may be provided with additional sealing element (e.g., sealing gasket or O-ring) at the respective engaging interface region to further enhance interdicting capability against ambient contamination.

A lower diffuse inducing component is provided on the storage portion 225 of the seat member 222 in the workpiece receiving region, and is configured to allow extraction of gas-phase contaminants under the workpiece $R_2$ from the interior of the storage assembly. It is expected that the gas-phase contaminants under a pattern area P of the received reticle $R_2$ can be efficiently reduced. In the illustrated embodiment, the lower diffuse inducing component is formed with a plurality of diffuse port assemblies 227a arranged within a planar projection (e.g., projection along z-direction onto x-y plane indicated in the figure) of the pattern region P of the workpiece $R_2$.

The placement location for the diffuse port assemblies 227a on the storage portion 225 may take various factors into consideration, such as weight distribution, structural integrity, and overall weight limit of the device components. For one thing, the exemplary diffuse port assemblies 227a are placed in the workpiece receiving region over the seat member 222 yet offset the geometric center region (e.g., region C) thereof. The off-center placement of the diffuse port assembly allows the material at the central region to be left intact, whereby the overall structural integrity of the seat member 222 may be better maintained (e.g., against thermal expansion, warpage during machine tooling, etc.), and the mass distribution may be kept closer toward the geometric center thereof for better overall balance. In addition, the location of the exemplary diffuse port assembly evades other pre-designated functional components, such as windows and substrate supporting mechanisms. In some embodiments, the geometric center region C is provided with a width/radius from about 25 to 30 mm.

In the illustrated embodiment, the seat cover 221 is provided with an upper diffuse inducing component 229 (e.g., over a top surface thereof) that enables fluid communication between the ambient and the interior volume of the storage assembly 220 (over the workpiece $R_2$). Accordingly, extraction or reduction of gas-phase contaminants or airborne molecular contaminants over the workpiece $R_2$ may be achieved via micro-fluidic flowing effect (e.g., convection or diffusion).

Referring concurrently to FIG. 2B, a workpiece $R_2$ is received in an inner pod 220' comprising a seat member 222' and a seat cover 221'. The placement location of the upper diffuse inducing component 229/229' may affect the efficiency of dust/gas-phase contaminants removal over top face of the workpiece $R_2$. For instance, the exemplary upper diffuse inducing component 229/229' defines a generally circular diffusion port pattern, which covers over the geometric central region of the seat cover 222. As the geometric centers of the exemplary seat cover 221 and seat member 222 are substantially aligned, it follows that the upper diffusion port (e.g., component 229/229') projectively overlaps the geometric center region of the seat member 222 upon closure. The center-lapping arrangement of the diffusion port generally allows the accommodation of filter membrane with larger planar size. In addition, the exemplary upper diffuse inducing component 229/229' are arranged fully overlapping the workpiece $R_2$ over the central region thereof.

Test results confirmed that the central placement of the diffuse port (e.g., component 229/229') facilitates enhanced cleaning efficiency. For instance, the substantially central placement of the upper diffuse port allows most of the inward gas flow (e.g., either through natural diffusion or force-induced gas flow through CDA purging) through the upper diffuse inducing component 229/229' to be directed toward the center region of the workpiece's top surface. As such, dust/gas-phase contaminants over top face of the workpiece $R_2$ would be more efficiently swept away from the workpiece $R_2$. Moreover, the substantially geometrically symmetrical arrangement of the upper diffuse port enables contaminant removal over the workpiece in a more uniform manner. For instance, in the illustrated embodiment, the upper diffuse inducing component 229 is arranged with its center region protectively overlaps the geometric center region C of the seat member 222. Such central placement of the diffusion port allows the utilization of the filter membrane with the largest possible planar area, thereby increasing diffusion efficiency and cleaning uniformity.

In some embodiments (such as shown in FIG. 2A), a side wall 221a of the seat cover 221 is further provided with a plurality of air flow channels 228 and at least one filter member 228a arranged to cover the air flow channels 228.

During operational usage (e.g., after the container system is wet cleaned/washed), there may be water residual on the internal surface thereof. The water residual may attract dirt thus increase the possibility of contamination of the received workpiece. By changing the surface characteristics of the storage assembly, the storage assembly may be dried more easily after cleaning. Accordingly, downtime due to baking/drying processes after cleansing may be reduced. Moreover, surface treatment (e.g., hydrophobic treatment) of the storage assembly 220 may reduce stiction of fine dusts and make it easier to wash them away, thereby increasing the dust-proofing ability of the storage assembly.

The inner container pod (e.g., storage assembly 220) may be divided into different regions, on which different surface treatments of hydrophilicity and hydrophobicity are applied. In some embodiments, one or both the seat cover 221 and the seat member 222 may be surface-treated, either partially/selectively or in its entirety. For example, in some embodiments, the interior surface (e.g., the inwardly exposed surface upon closure of the inner pod) of the seat cover 221 and the seat member 222 may receive hydrophilic treatment (e.g., at regions that correspond to the normal projection of a received workpiece), while the remaining regions be left none-treated or hydrophobic-treated.

In some embodiments, the workpiece accommodating region 222a of the seat member 222 is treated with a first type treatment. In some embodiments, the first type treatment area comprises a hydrophilic treatment area. Upon occurrence of water condensation due to ambient condition changes (e.g., equipment malfunction), water droplets occurred in the workpiece accommodating region 222a (e.g., the inner central region under the normal projection of a received reticle) may generate a smaller wetting angle (which translates to a lower overall droplet height), thus reducing the likelihood of condensation contact with a stored reticle.

In some embodiments, the interior surface of the seat member is further treated with a second type surface treatment. For instance, the seat member 222 includes a second type treatment area (e.g., the periphery area) arranged around the workpiece accommodating region 222a. In some embodiments, the second type treatment area comprises a hydrophobic treatment area. The seat member 222 provided with the hydrophobic treatment may be dried more easily after cleaning. In some embodiments, the outer surface (e.g., the outwardly exposed surface upon closure of the inner pod) of the seat member 222 may also be treated with hydrophobic treatment.

In some embodiments, the seat member 222 and the seat cover 221 are substantially made of metal. Furthermore, the hydrophobic treatment area is provided with a surface resistance value less than about $10^{11} \Omega$. For example, the hydrophobic coating over the storage assembly may be kept below 1 um to maintain static charge dissipating capability. In some embodiments, a hydrophobic layer over the hydrophobic treatment area has a thickness of less than about 1 um.

Figure 3:
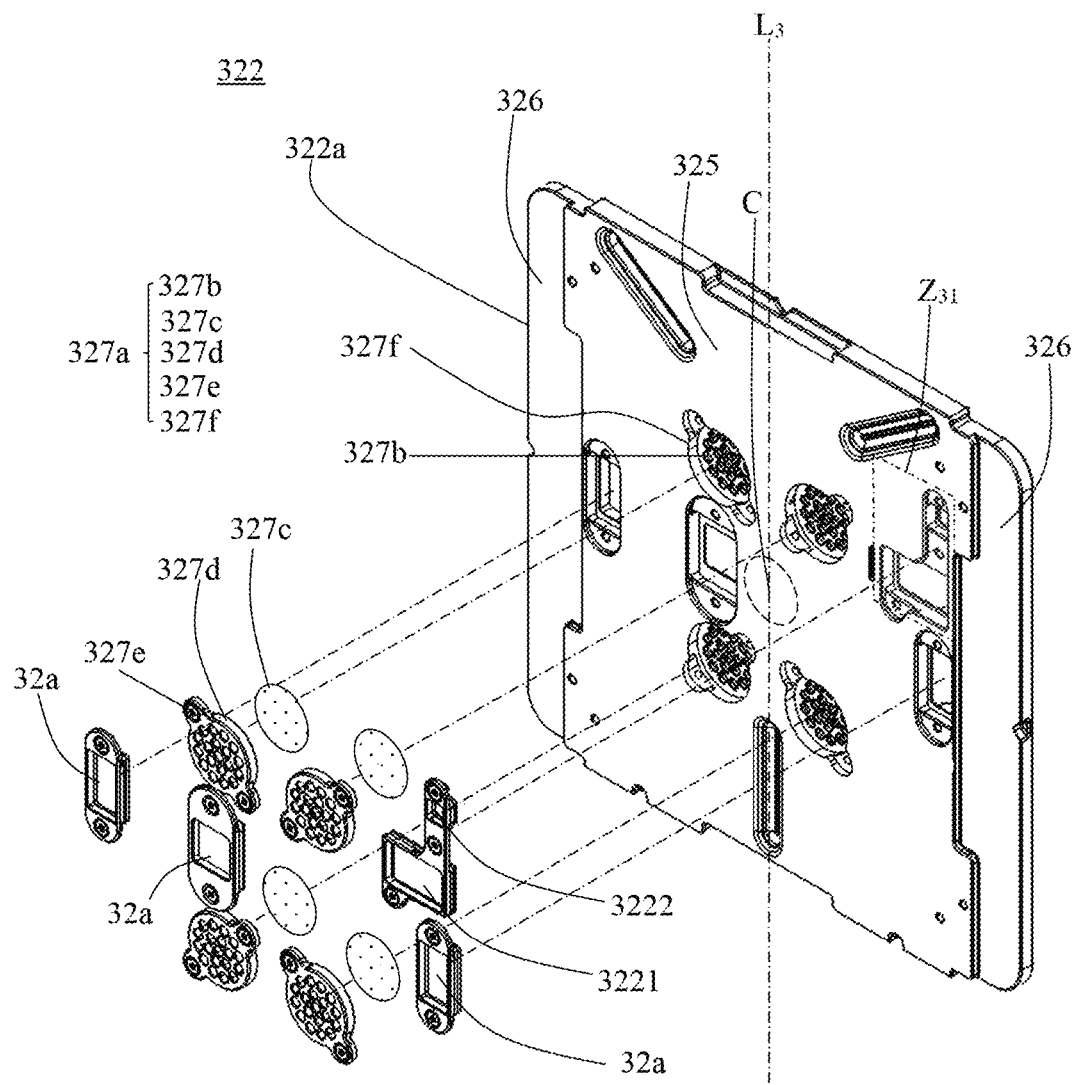
FIG. 3 illustrates an isometric exploded view of a seat member in accordance with some embodiment of the instant disclosure.

FIG. 3 illustrates an isometric exploded view of a seat member in accordance with some embodiment of the instant disclosure. For illustrational simplicity and clarity, some detail/sub components of the exemplary device are not explicitly labeled in the instant figure.

In the illustrated embodiment, the seat member 322 comprises a main body 322a that has a storage portion 325 defining a longitudinal axis $L_3$ through a geometric center region C thereof. The main body 322a further comprises a pair of flank portions 326 that extend along the longitudinal axis $L_3$, each having a reduced thickness (i.e., thinner than that of the storage portion 325). The material, surface treatment, and/or coating arrangements described in previous embodiments may be applied to the exemplary seat member 322.

The exemplary seat member 322 comprises a plurality of diffuse port assemblies 327a arranged on a bottom face of the main body 322a. In the illustrated embodiment, the diffuse port assembly 327a includes a plurality of ports 327b arranged through the main body 322a and a filter membrane 327c configured to cover the ports 327b. In the illustrated embodiment, the diffuse port assembly 327a is further provided with a lower filter cover (e.g., filter cover 327d) configured to retain the filter membrane 327c. The exemplary filter cover 327d is made of a perforated plate provided with a planar area comparable to the filter membrane 327c. In some embodiments, the filter cover may be fastened on the bottom face of the seat member 322 through a snap-fit assembly (e.g., having a latch member 1327d as shown in FIG. 13). In the illustrated embodiment, the diffuse port assembly 327a is further provided with a cover retaining member 327e (such as screws) configured to fasten the filter cover 327d on to the bottom face of the seat member 322.

The configuration of the diffuse port assemblies 327a on the main body 322a of the seat member 322 may take various factors into consideration, such as the overall flatness of the outer surface (e.g., bottom face) of the seat member 322 upon assembly. For example, the exemplary filter cover 327d is configured to be embedded in the main body 322a, such that an outwardly-facing surface of the filter cover 327d does not protrude from the bottom face of the seat member 322. In the illustrated embodiment, the diffuse port assembly 327a is provided with a recess feature 327f on the bottom face of the main body 322a of the seat member 322, which is configured to accommodate the filter cover 327d. In some embodiment, the provision of the recess features 327f also serves a weight-shaving measure that reduces the overall mass of the main body 322a.

The material for the seat member may take various factors into consideration, such as the ambient environment to which it exposes to (e.g., the condition inside an exposure device). For one thing, conventional filter components often contain certain base materials (e.g., Teflon/PTFE). However, in certain delicate applications (e.g., EUV lithography process), exposure of certain content in the filter element to extreme ambient condition (e.g., EUV emission) may result in the generation of undesirable byproduct (e.g., outgas) detrimental to the fabrication process. In some embodiments, the lower filter membrane (e.g., filter membrane 327c) is substantially free of fluorine content. In some embodiments, the filter membrane may be substantially made from metallic material, such as nickel. In some embodiments, the metallic filter membrane may be fabricated by electroforming process. In some embodiments, the filter cover and the cover fastener are also substantially free of fluorine content. Suitable materials for the filter cover and the cover fastener may be metal, such as aluminum.

As shown in the instant figure, the seat member 322 is provided with a first observable zone $Z_{31}$ within the storage portion 325 to allow observation of a received substrate. In the illustrated embodiment, the seat member 322 includes two inner optical members 3221, 3222 embedded in the first observable zone $Z_{31}$. In some embodiments, the inner optical member 3221/3222 may be sealingly installed in the first observable zone $Z_{31}$. For example, the construction of the inner optical member 3221/3222 may include a sealing member around the optically transmissive member (e.g., O-ring). In general, the construction of the inner optical member 3221/3222 provides a sealing enclosure capable of sufficiently preventing dust and humidity from entering into the interior volume through the structural interface between the optical member and the seat member. In some embodiments, the optical member 3221/3222 may be constructed to achieve airtight level sealing. In some embodiments, suitable material of two inner optical members 3221, 3222 may be comparable to those described in the previous embodiments.

Figure 4:
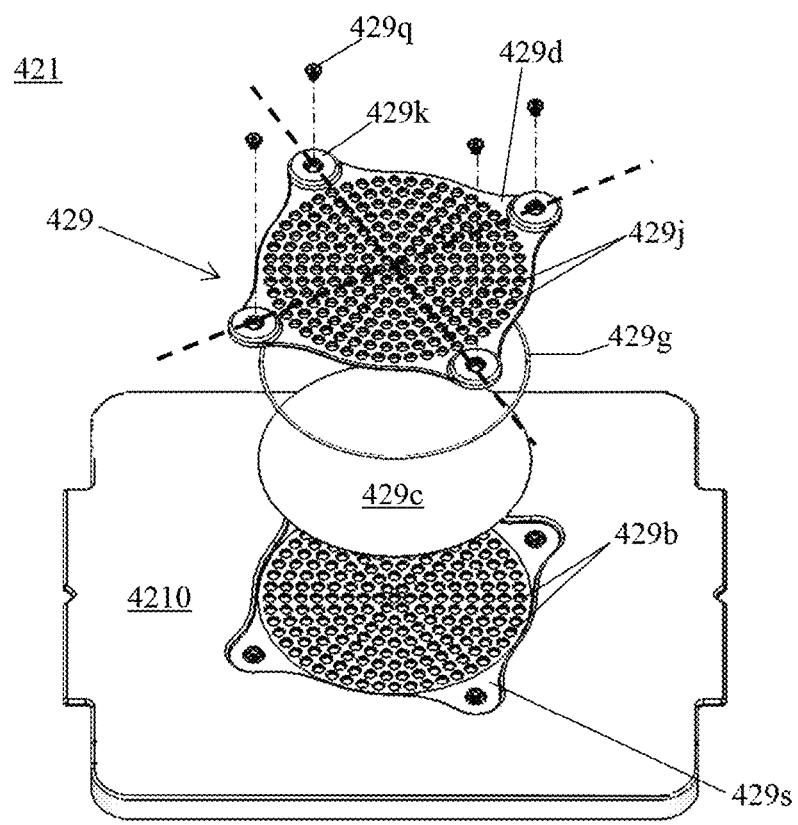
FIG. 4 illustrates an isometric exploded view of the components of a seat cover in accordance with some embodiment of the instant disclosure.

FIG. 4 an isometric exploded view of a seat cover in accordance with some embodiment of the instant disclosure.

In the illustrated embodiment, the seat cover 421 comprises a body 4210 and an upper diffuse inducing component (collectively referred to as component 429) configured to enable fluid communication between the two opposite sides of the body 4210. The exemplary upper diffuse inducing component 429 is provided with a plurality of apertures 429b arranged through a central region of the body 4210, an upper filter membrane 429c arranged to cover the apertures 429b, and filter retainer configured to retain the upper filter membrane 429c.

The filter retainer (e.g., upper filter cover 429d) is also configured to enable fluid access to a filter membrane/sheet retained there-under. For example, the upper filter cover 429d is formed with through holes 429j that allow fluid access to the upper filter membrane 429c. In the illustrated embodiment, when the upper filter cover 429d is mounted on the body 4210, the apertures 429b formed on the body 4210 are bought into alignment with the through holes 429j formed on the upper filter cover 429d. The alignment of the through holes 429j and the apertures 429b enables fluid communication between opposite sides of the body 4210. The apertures 429b on the body 4210 may be arranged to form a symmetrical pattern, such as a circular pattern as shown in the instant example. A symmetrical pattern of the apertures 429b may help to generate a uniform flow over a workpiece there-under.

The upper filter membrane 429c is configured to prevent particulate contaminants (e.g., dust) from passing therethrough. In some embodiments, upper filter membrane 429c may comprise fabric-based material. In some embodiments, the upper filter membrane 429c has substantially different material composition than the lower filter membrane (e.g., filter membrane 327 shown in FIG. 3). For example, the upper filter membrane 429c may comprise fabric-based material with fluorine-based coating (e.g., PTFE), while the lower filter membrane (e.g., filter membrane 329c) is substantially free of fluorine content.

In some embodiments, a filter retainer (e.g., upper filter cover 429d) may be coupled to the body 4210 through one or more fastener (e.g., upper cover retaining member 429q). Accordingly, the exemplary upper filter cover 429d is further provided with retainer seats 429k configured to receive the retaining members 429q. In the illustrated embodiment, the retaining member 429k comprises four screws arranged at the four respective corners of the upper filter cover 429d. In other embodiments, fasteners of other shapes and forms may be utilized, such as retaining clips, hooks, or the like. In some embodiments, the placement location of the retainer seats 429k may be symmetrically arranged around the filter sheet under the filter retainer so as to exert uniform stress toward the filter sheet. For example, in the illustrated example, the four retainer seats 429k are arranged across two mutually perpendicular bisectors (indicated by dotted lines in the instant figure) of the circular pattern defined by the through holes 429j. Moreover, a geometric center region of the body 4210 is further formed with a recess feature 429s shaped and sized to receive the upper filter cover 429d, whereby the overall thickness of the seat cover 421 may be reduced.

In the illustrated embodiment, the upper diffuse inducing component 429 is further provided with a sealing member for enhancing the sealing engagement between the filter cover 429d and the seat cover 421. For example, the filter module 429 comprises a sealing ring 429g arranged between the periphery of the filter cover 429d and the seat cover 421.

Figure 5:
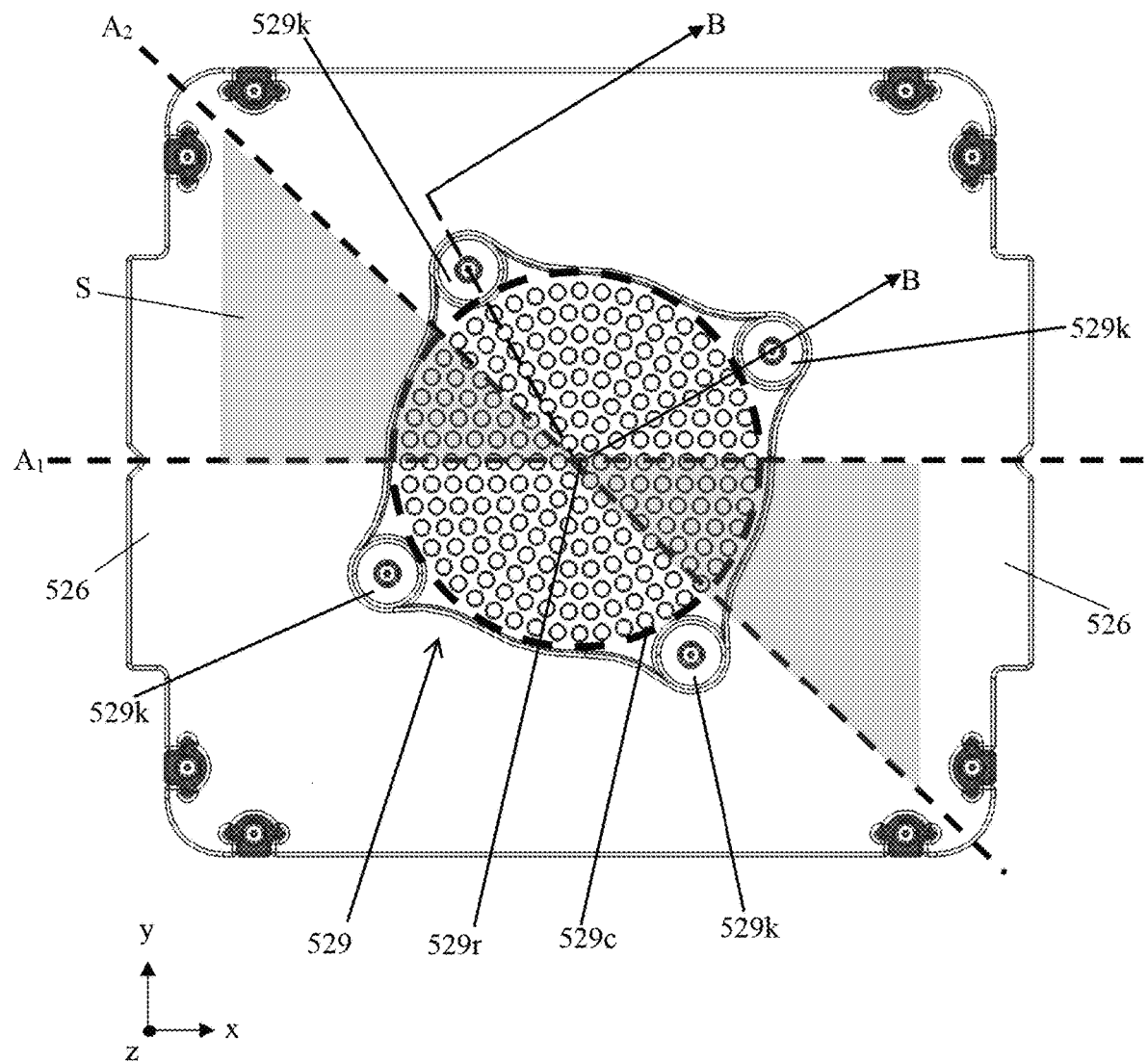
FIG. 5 illustrates a top view of a seat cover in accordance with some embodiment of the instant disclosure.

FIG. 5 illustrates a top view of a seat cover in accordance with some embodiment of the instant disclosure. For illustrational simplicity and clarity, some detail/sub components of the exemplary device are not explicitly labeled in the instant figure.

The placement location for a diffuse inducing component (e.g., the upper diffuse inducing component 529) over the seat cover may take various factors into consideration, e.g., fluid flow and flow uniformity over a top surface of a workpiece (e.g., reticle $R_2$) arranged under the upper diffuse inducing component to name a few. In the illustrated embodiment, the upper diffuse inducing component 529 has a geometric center 529r substantially aligned with a geometric center of the seat cover 521. The concentrically arranged upper diffuse inducing component 529 facilitates the generation of uniform flow that radiates from the center region of the workpiece toward its four edges. In addition, the concentric arrangement of the upper diffuse inducing component 529 also allows the upper filter membrane 529c to be configured with a large planar area. A large area of the upper filter membrane 529c may support a larger fluid flow. The large fluid flow and the uniform flow may both be beneficially contribute to the efficiency of particulate/gas phase contaminant removal over top face of workpiece. In some embodiments, a size of the upper filter membrane is at least 25% of the planar area of the workpiece. In some embodiments, the diameter of the upper filter membrane is about 90 mm.

In some embodiments, fastener seats of a filter retainer (e.g., seat 529k) are arranged to concurrently offset a region that includes two axes of symmetry of the seat cover. For example, the exemplary retainer seats 529k are arranged offsetting a region S (indicated by shaded area in FIG. 5) that's included between the two intersecting axes of symmetry ($A_1$, $A_2$) of the seat cover 521. In the illustrated embodiment, one of the axes of symmetry (e.g., axis $A_1$) includes a perpendicular bisector of the body of the exemplary seat cover 521. Particularly, the axes $A_1$ passes through a pair of flanks 526 of the seat cover 521. The other axis of symmetry (e.g., axis $A_2$) includes a diagonal of the seat cover 521. The two symmetry of axes $A_1$, $A_2$ intersect at the geometric center 529r, thereby forming two pairs of vertically opposite angels. The exemplary region S is defined by the pair of vertically opposite angels that are less than 90 degrees. In some embodiments, the acute vertically opposite angels is no more than 45 degree. In some embodiments, the value of the smaller vertically opposite angels is from about 35 to 40 degree.

When a distance between the retainer seats 529k and the geometry center 529r of the upper filter cover 529 is too small, the four retainer seats 529k that are formed at the four corners of the upper filter cover 529 may be unable to offset/evade the region S. The concentric arrangement of the upper diffuse inducing component 529 allows the upper filter cover 529 to be configured with a larger diameter, thereby allowing the retainer seats 529k to be fabricated with a sufficiently large planar area so as to provide structural integrity while maintaining the offsetting arrangement.

Figure 6A:
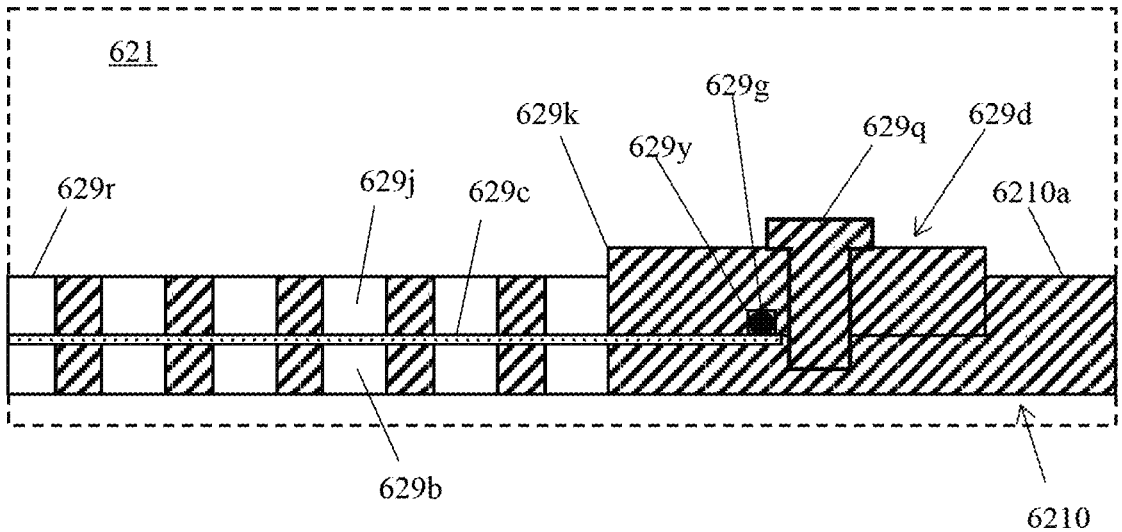
FIG. 6A illustrates a schematic cross-sectional view of a seat cover in accordance with some embodiment of the instant disclosure.
Figure 6B:
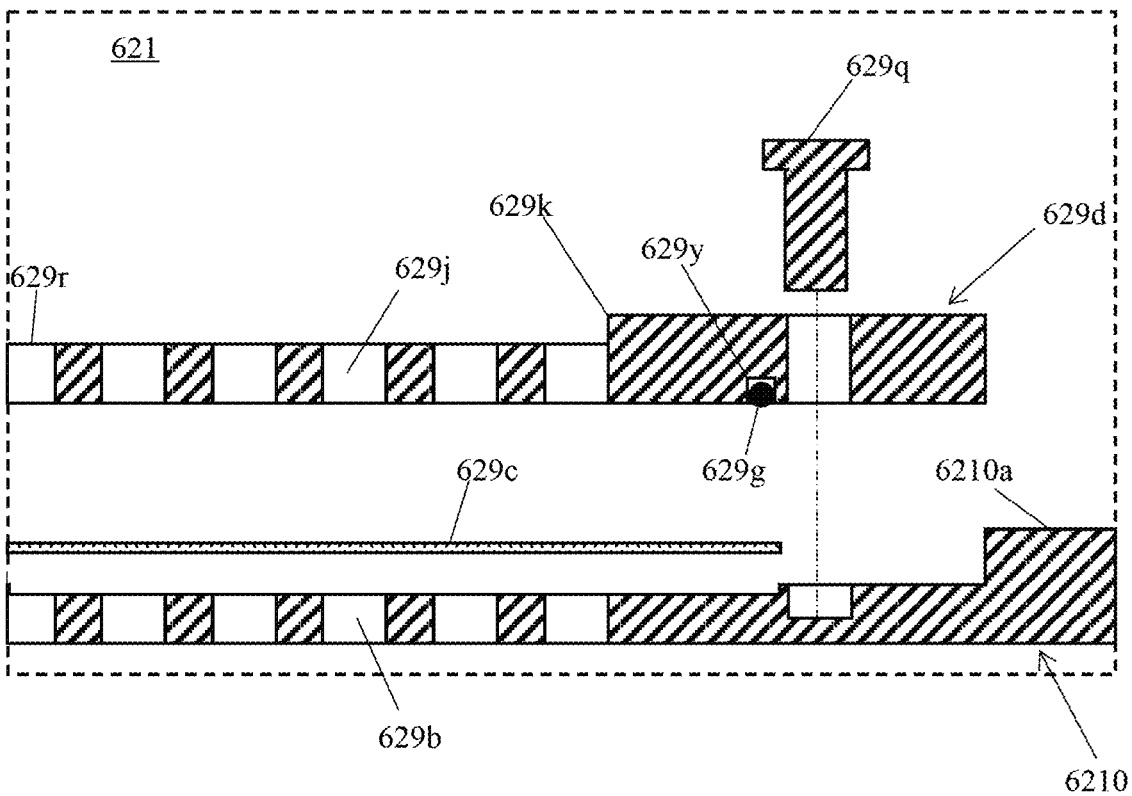
FIG. 6B illustrates a schematic exploded view of a seat cover in accordance with some embodiment of the instant disclosure.

FIG. 6A illustrates a schematic cross-sectional view of a seat cover in accordance with some embodiment of the instant disclosure. FIG. 6A may represent a schematic cross-sectional view along cutline B-B in FIG. 5. FIG. 6B illustrates a schematic dissembled view of the components of a seat cover in accordance with some embodiment of the instant disclosure. For illustrational simplicity and clarity, some detail/sub components of the exemplary device are not explicitly labeled in the instant figure.

Referring to FIGS. 6A and 6B concurrently, the seat cover 621 comprises a body 6210 and an upper diffuse inducing component provided with a plurality of apertures 629b arranged through the body 6210, an upper filter membrane 629c arranged to cover the apertures 629b, and an upper filter cover 629d configured to retain the upper filter membrane 429c while enable fluid access to the upper filter membrane 629c. When the upper filter cover 629d is mounted on the body 6210, the apertures 629b formed on the body 6210 are bought into alignment with the through holes 629j of the upper filter cover 629d.

In the illustrated embodiment, an upper filter cover 629d is mounted on the body 6210 by an upper cover retaining member 629q that is received by a retainer seats 629k. In the illustrated embodiment, a center region 629r of the upper filter cover 629d is no higher than an outer surface 6210a of the body 6210 of the seat cover 621. The retainer seat 629k has an upper surface higher than the outer surface 6210a.

As illustrated, the upper diffuse inducing component 629 further comprises a sealing ring 629g arranged between the periphery of the filter cover 629d and the body 6210 of the seat cover 621. The periphery of the exemplary filter cover 629d is formed with a downward facing annular groove 629y for receiving the sealing ring 629g.

In the current cut-away view, the exemplary through holes 629j and apertures 629b are provided with a substantially uniform width. However, the cross-sectional configuration of the holes and/or apertures may take many factors into consideration, such as the direction of air flowing therethrough. For example, the holes and/or apertures provided with downward decreasing width may facilitate an inward flow of air. On the contrary, the holes and/or apertures provided with upward decreasing width may facilitate an outward flow of air. In some embodiments, the holes and/or apertures may be provided with a tapered up/down cross-sectional profile. In some embodiments, the through holes 629j and/or the apertures 629b may be further provided with a chamfer.

Figure 7:
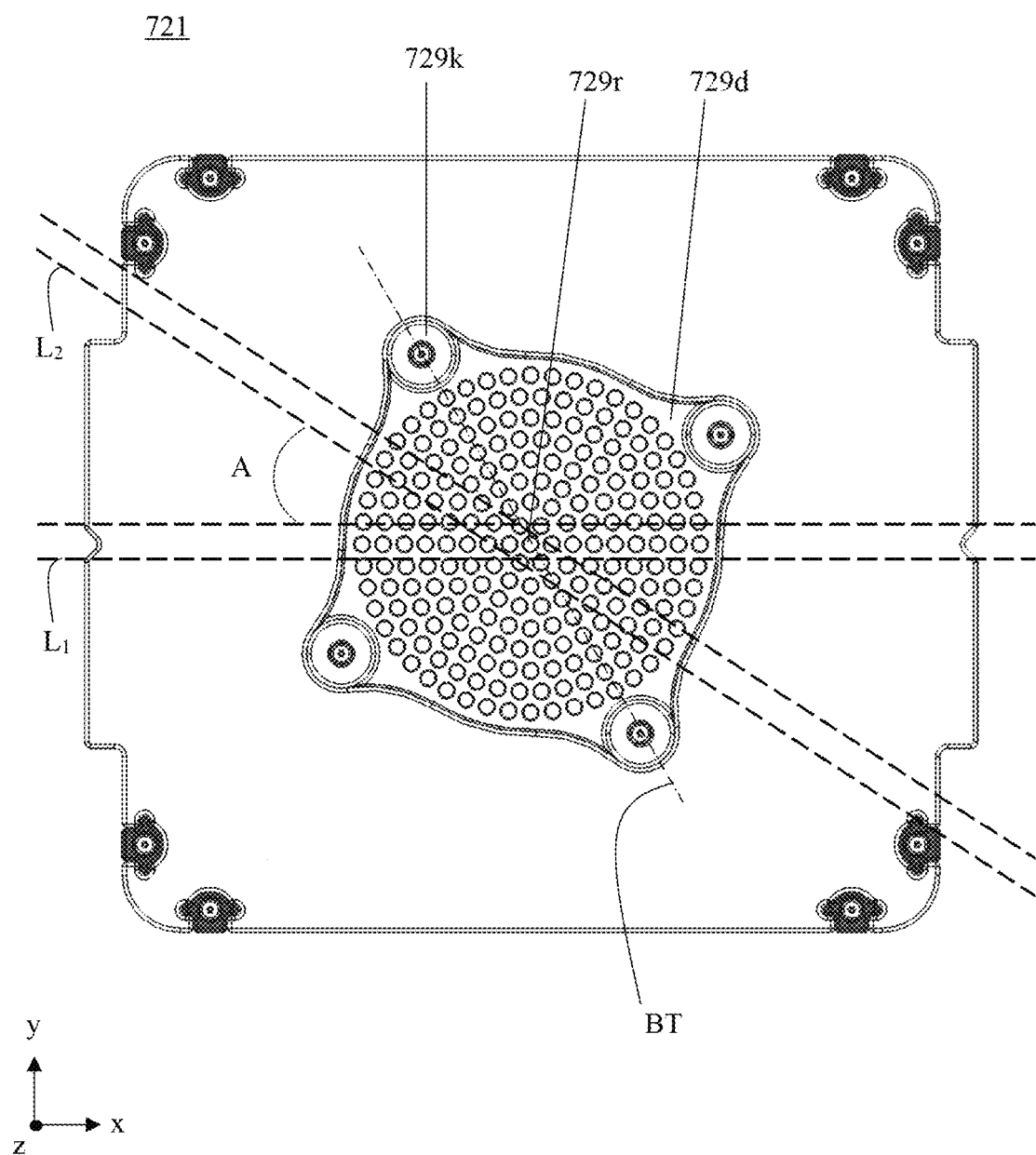
FIG. 7 illustrates a top view of a seat cover in accordance with some embodiment of the instant disclosure.

FIG. 7 illustrates a top view of a seat cover in accordance with some embodiment of the instant disclosure. For illustrational simplicity and clarity, some detail/sub components of the exemplary device are not explicitly labeled in the instant figure.

For executing a lithography process, the storage assembly may be opened upon arriving at a designated position/station (e.g., a workpiece loading station) inside an exposure apparatus, prior to a subsequent exposure process that employs the contained reticle. The position and/or orientation of the storage assembly at the designated position may be inspected in order to prevent the delicate storage assembly and/or the reticle contained therein from accidental damage during the subsequent procedure (e.g., the disassembling of the storage assembly).

In some applications (e.g., in an EUV exposure apparatus), the accuracy of the position and/or orientation of the storage assembly would be inspected though optical means, such as optical positioning sensors (e.g., laser scanning device). For instance, FIG. 7 schematically shows a top view of the seat cover under an operational scenario of a laser optical positioning procedure. In the illustrated process, two intercepting laser beams $L_1$, $L_2$ (indicated by dotted lines) are generated over the top surface of an exemplary seat cover 721. In particular, the laser beam $L_1$ is arranged along a perpendicular bisector of the seat cover 721, while the laser beam $L_2$ is arranged to intersect laser beam $L_1$ at an angle A no more than 45 degree.

In a case that the seat cover 721 is not precisely positioned/orientated, components of the seat cover 721 may block one or both of the laser beams $L_1$, $L_2$. For example, when the storage assembly is tilted with respect to the x-y plane, top surface of the seat cover 721 may block the laser beams $L_1$, $L_2$. When one of the laser beams $L_1$, $L_2$ is found to be blocked by the seat cover 721, an output indicating failure of positioning may be generated (e.g., by an output unite such as a display).

The exemplary retaining seats 729*k* are provided with higher thickness (e.g., along z-direction) that protrude from a top surface of the central region 729*r* of the filter cover 729*d*, so as to ensure retaining effectiveness (e.g., maintain sufficient screw length). As the inner pod is accurately positioned, the geometrically asymmetrical/radially skewed placement of the retaining seats 729*k* may concurrently evade the two laser beams $L_1$, $L_2$ during the optical positioning process, thereby avoiding blockage of the laser beams. In the illustrated embodiment, the retaining seats 729*k* of the seat cover 721 are arranged to offset a region that includes the two axes of symmetry of the seat cover 721 (e.g., a perpendicular bisector and a diagonal). In other words, a bisector of the filter cover 729*d* (e.g., line BT that passes through two of the retaining seats 729*k*) is arranged to concurrently offset a perpendicular bisector and a diagonal of the seat cover 721.

Accordingly, one aspect of the instant disclosure provides a workpiece container system comprising a storage assembly. The storage assembly comprises a seat member and a seat cover. The seat member defines a workpiece receiving region that encompasses a geometric center region thereof, configured to receive a workpiece; wherein a lower diffuse inducing component is provided on the seat member within a planar projection of the workpiece yet offsets the geometric center region. The seat cover is configured to engage the seat member at a periphery region around the workpiece receiving region thereof, so as to cooperatively form an enclosure for housing the workpiece; wherein an upper diffuse inducing component is provided on the seat cover over the planar projection of the workpiece and protectively overlaps the geometric center region of the seat member.

In some embodiments, the upper diffuse inducing component has a geometric center substantially aligned with a geometric center of the seat cover.

In some embodiments, the upper diffuse inducing component comprises an upper filter cover and an upper filter membrane configured to be retained by the upper filter cover on the seat cover. The upper filter cover is arranged to enable fluid access to the upper filter membrane. A center region of the upper filter cover is no higher than an outer surface of the seat cover.

In some embodiments, the upper filter cover further comprises a retainer seat configured to receive upper cover retaining member. The retainer seat has an upper surface higher than the outer surface of the seat cover.

In some embodiments, the retainer seat is arranged to concurrently offset a region that includes two axes of symmetry of the seat cover.

In some embodiments, one of the axes of symmetry includes a perpendicular bisector of the seat cover.

In some embodiments, one of the axes of symmetry includes a diagonal of the seat cover.

In some embodiments, a size of the upper filter membrane is at least 25% of the planar area of the workpiece.

In some embodiments, the lower diffuse inducing component comprises a diffuse port assembly arranged in the workpiece receiving region around the geometric center region of the seat member. The diffuse port assembly includes a lower filter cover, a lower filter membrane configured to be retained by the lower filter cover, and a lower cover retaining member. The upper diffuse inducing component is provided with an upper filter membrane having substantially different material composition than the lower filter membrane.

In some embodiments, the lower filter membrane is substantially free of fluorine content.

Accordingly, one aspect of the instant disclosure provides a workpiece container system comprising a storage assembly. The storage assembly comprises: a seat member defining a workpiece receiving region that encompasses a geometric center region thereof, configured to receive a workpiece; and a seat cover configured to engage the seat member at a periphery region around the workpiece receiving region thereof, so as to cooperatively form an enclosure for housing the workpiece. An upper diffuse inducing component is provided on the seat cover over the planar projection of the workpiece. The upper diffuse inducing component has a geometric center substantially aligned with a geometric center of the seat cover.

In some embodiments, the upper diffuse inducing component comprises an upper filter cover and an upper filter membrane configured to be retained by the upper filter cover on the seat cover. The upper filter cover is arranged to enable fluid access to the upper filter membrane. A center region of the upper filter cover is no higher than an outer surface of the seat cover.

In some embodiments, the upper filter cover further comprises a retainer seat configured to establish retaining engagement with the seat cover. The retainer seat is arranged to concurrently offset a region that includes two axes of symmetry of the seat cover.

In some embodiments, one of the axes of symmetry includes a perpendicular bisector of the seat cover.

In some embodiments, one of the axes of symmetry includes a diagonal of the seat cover.

In some embodiments, the retainer seat has an upper surface higher than the outer surface of the seat cover.

In some embodiments, a size of the upper filter membrane is at least 25% of the planar area of the substrate.

In some embodiments, a lower diffuse inducing component is provided on the seat member within a planar projection of the workpiece yet offsets the geometric center region. The lower diffuse inducing component comprises a diffuse port assembly arranged in the workpiece receiving region around the geometric center region of the seat member. The diffuse port assembly includes a lower filter cover, a lower filter membrane configured to be retained by the lower filter cover, and a lower cover retaining member. The upper diffuse inducing component is provided with an upper filter membrane having substantially different material composition than the lower filter membrane.

In some embodiments, the lower filter membrane is substantially free of fluorine content.

In some embodiments, the system further comprises a transport assembly configured to receive the storage assembly.

The embodiments shown and described above are only examples. Therefore, many such details are neither shown nor described. Even though numerous characteristics and advantages of the present technology have been set forth in the foregoing description, together with details of the structure and function, the disclosure is illustrative only, and changes may be made in the detail, especially in matters of shape, size, and arrangement of the parts within the principles, up to and including the full extent established by the broad general meaning of the terms used in the claims. It will therefore be appreciated that the embodiments described above may be modified within the scope of the claims.

What is claimed is:

1. A workpiece container system, comprising:
a storage assembly that comprises:
a seat member defining a workpiece receiving region that encompasses a geometric center region thereof, and that is configured to receive a workpiece,
wherein a lower diffuse inducing component is provided on the seat member within a planar projection of the workpiece yet offsets the geometric center region; and
a seat cover configured to engage the seat member at a periphery region around the workpiece receiving region, so as to cooperatively form an enclosure for housing the workpiece, wherein:
an upper diffuse inducing component is provided on the seat cover over the planar projection of the workpiece, the upper diffuse inducing component projectively overlapping the geometric center region of the seat member, and comprising a plurality of ports arranged in a circular pattern that has a geometric center substantially aligned with a geometric center of the seat cover,
the upper diffuse inducing component further comprises an upper filter cover and an upper filter membrane configured to be retained by the upper filter cover on the seat cover,
the upper filter cover has a plurality of holes to enable fluid access to the upper filter membrane, and
each of the plurality of holes aligns with one of the plurality of ports in the upper diffuse inducing component.

2. The system of claim 1, wherein:
a center region of the upper filter cover is not higher than an outer surface of the seat cover.

3. The system of claim 2, wherein:
the upper filter cover further comprises a retainer seat configured to receive an upper cover retaining member, and
the retainer seat has an upper surface higher than the outer surface of the seat cover.

4. The system of claim 3, wherein the retainer seat is arranged to concurrently offset a region that includes two axes of symmetry of the seat cover.

5. The system of claim 4, wherein one of the two axes of symmetry includes a perpendicular bisector of the seat cover.

6. The system of claim 4, wherein one of the two axes of symmetry includes a diagonal of the seat cover.

7. The system of claim 1, wherein a size of the upper filter membrane is at least 25% of a planar area of the workpiece.

8. The system of claim 1, wherein:
the lower diffuse inducing component comprises a diffuse port assembly arranged in the workpiece receiving region around the geometric center region of the seat member,
the diffuse port assembly includes a lower filter cover, a lower filter membrane configured to be retained by the lower filter cover, and a lower cover retaining member, and
the upper diffuse inducing component is provided with an upper filter membrane having a substantially different material composition than the lower filter membrane.

9. The system of claim 1, wherein the plurality of ports is arranged concentrically and a concentric center of the plurality of ports is aligned with the geometric center of the seat cover.

10. The system of claim 1, wherein:
the upper diffuse inducing component further comprises a sealing ring arranged between the upper filter cover and the seat cover; and
the upper filter cover further comprises a downward facing annular groove for receiving the sealing ring.

11. A workpiece container system, comprising:
a storage assembly that comprises:
a seat member defining a workpiece receiving region that encompasses a geometric center region thereof, and that is configured to receive a workpiece; and
a seat cover configured to engage the seat member at a periphery region around the workpiece receiving region thereof, so as to cooperatively form an enclosure for housing the workpiece, wherein:
an upper diffuse inducing component is provided on the seat cover over a planar projection of the workpiece, the upper diffuse inducing component comprising a plurality of ports arranged in a circular pattern that has a geometric center substantially aligned with a geometric center of the seat cover,
the upper diffuse inducing component comprises an upper filter cover and an upper filter membrane configured to be retained by the upper filter cover on the seat cover,
the upper filter cover has a plurality of holes to enable fluid access to the upper filter membrane, and
each of the plurality of holes aligns with one of the plurality of ports in the upper diffuse inducing component.

12. The system of claim 11, wherein:
a center region of the upper filter cover is not higher than an outer surface of the seat cover.

13. The system of claim 11, wherein:
the upper filter cover further comprises a retainer seat configured to establish retaining engagement with the seat cover, and
the retainer seat is arranged to concurrently offset a region that includes two axes of symmetry of the seat cover.

14. The system of claim 13, wherein one of the two axes of symmetry includes a perpendicular bisector of the seat cover.

15. The system of claim 13, wherein one of the two axes of symmetry includes a diagonal of the seat cover.

16. The system of claim 13, wherein the retainer seat has an upper surface higher than an outer surface of the seat cover.

17. The system of claim 13, wherein a size of the upper filter membrane is at least 25% of a planar area of the workpiece.

18. The system of claim 11, wherein:
a lower diffuse inducing component is provided on the seat member within a planar projection of the workpiece yet offsets the geometric center region,
the lower diffuse inducing component comprises a diffuse port assembly arranged in the workpiece receiving region around the geometric center region of the seat member,
the diffuse port assembly includes a lower filter cover, a lower filter membrane configured to be retained by the lower filter cover, and a lower cover retaining member, and
the upper diffuse inducing component is provided with an upper filter membrane having a substantially different material composition than the lower filter membrane.

19. The system of claim 11, wherein the seat cover further comprises:
- a body having the plurality of ports arranged through a central region of the body, wherein:
- the upper filter membrane is arranged over the plurality of ports; and
- the upper filter cover covers the upper filter membrane.

\* \* \* \* \*